United States Patent
Mi

(10) Patent No.: US 6,914,708 B2
(45) Date of Patent: *Jul. 5, 2005

(54) APPARATUS AND METHOD FOR SELECTIVELY EXPOSING PHOTOSENSITIVE MATERIALS USING A SPATIAL LIGHT MODULATOR

(75) Inventor: Xiang-Dong Mi, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/760,812

(22) Filed: Jan. 20, 2004

(65) Prior Publication Data

US 2004/0145794 A1 Jul. 29, 2004

Related U.S. Application Data

(63) Continuation-in-part of application No. 10/242,048, filed on Sep. 12, 2002, now Pat. No. 6,751,003.

(51) Int. Cl.⁷ ............................. G02F 1/03; G02F 1/07
(52) U.S. Cl. ...................................... 359/247; 359/261
(58) Field of Search ................................ 359/247, 251, 359/261; 349/123; 356/400, 399, 401

(56) References Cited

U.S. PATENT DOCUMENTS

| | | | |
|---|---|---|---|
| 4,974,941 A | 12/1990 | Gibbons et al. | |
| 5,325,137 A | 6/1994 | Konno et al. | |
| 5,389,698 A | 2/1995 | Chigrinov et al. | |
| 5,602,661 A | 2/1997 | Schadt et al. | |
| 5,691,541 A | 11/1997 | Ceglio et al. | |
| 5,808,800 A | 9/1998 | Handschy et al. | |
| 6,060,224 A | 5/2000 | Sweatt et al. | |
| 6,061,138 A | 5/2000 | Gibbons et al. | |
| 6,751,003 B2 * | 6/2004 | Mi | 359/247 |
| 2002/0027624 A1 | 3/2002 | Seiberle | |

OTHER PUBLICATIONS

Y. Iimura; Prospects of the Photo–Alignment Technique for LCD Fabrication; SID 97 Digest; pp. 311–314.

H. Seiberle, D. Muller, G. Marck, and M.Schadt; Photo-alignment of LCoS LCDs; Journal of the SID Oct. 1, 2002; pp. 31–35.

* cited by examiner

*Primary Examiner*—Scott J. Sugarman
*Assistant Examiner*—Richard Hanig
(74) *Attorney, Agent, or Firm*—Nelson Adrian Blish

(57) ABSTRACT

An exposure apparatus (8) for fabricating optical film (40) by exposing a pattern such as for photoalignment, where the optical film (40) has a photosensitive layer (20) and a substrate (10). The exposure apparatus (8) directs an exposure beam from a light source (1) to a reflective polarization modulation device (88). The modulated exposure beam is then directed onto the photosensitive layer (20) for forming a pattern onto the optical film (40). A reflective surface (50) is disposed to reflect, back through the optical film (40), a portion of the exposure beam transmitted through the optical film (40), in order to obtain a photoreactive response. The source of exposure radiation and the reflective surface (50) are on opposite sides of the optical film (40).

19 Claims, 4 Drawing Sheets

APPARATUS AND METHOD FOR SELECTIVELY EXPOSING PHOTOSENSITIVE MATERIALS USING A SPATIAL LIGHT MODULATOR

CROSS REFERENCE TO RELATED APPLICATIONS

This is a continuation-in-part of application Ser. No. 10/242,048, filed Sep. 12, 2002 now U.S. Pat. No. 6,751,003, entitled APPARATUS AND METHOD FOR SELECTIVELY EXPOSING PHOTOSENSITIVE MATERIALS USING A REFLECTIVE LIGHT MODULATOR, by Xiang-Dong Mi.

FIELD OF THE INVENTION

This invention generally relates to a method and a system for manufacturing an optical film and more particularly relates to a method and system for fabrication of an optical film having a patterned layer formed by exposure of photosensitive material using a spatial light modulator.

BACKGROUND OF THE INVENTION

Considerable interest has been shown in photo-alignment methods for the fabrication of optical components including optical films. As just one example among many, U.S. Pat. No. 6,061,138 (Gibbon et al.) discloses a photo-alignment process using UV light for aligning a liquid crystal medium. Among the advantages of photo-alignment methods over traditional mechanical alignment methods, such as rubbing, is the capability to generate a high resolution pattern in the exposed photosensitive medium. Photo-alignment techniques can be used to form patterned alignment layers such as those used in an liquid crystal display (LCD) to create multi-domain liquid crystal structures and patterned optical films used as image cards, security cards, and the like. Depending upon the response characteristics of the photosensitive medium, patterns can be formed by changing various characteristics of the exposure energy, typically intensity or polarization, for example.

In photolithography, used, for example, in the manufacture of electronic circuits on silicon, a geometric pattern is imposed onto a photoresist wafer substrate by applying a mask to selectively block the exposure energy over specific areas. This same concept, using a static mask, can be applied to optical film fabrication, where the same regular pattern is used repeatedly as part of the fabrication process.

Driven in part by the high costs and schedule impact of mask fabrication and the difficulty of changing masks to correct for errors or to rework a fabrication process, the semiconductor industry has shown significant interest in "maskless" photolithography. Using this approach, as exemplified in U.S. Pat. No. 5,691,541 (Ceglio et al.) and U.S. Pat. No. 6,060,224 (Sweatt et al.), a digital micromirror device (DMD) is used to reflect a pattern onto the photoresist substrate. The DMD comprises an array of tiny mirrors, each separately addressable for reflecting light onto or away from the photoresist substrate. The exposure pattern can thus be formed on the DMD. Then, the exposure source is reflected from the DMD surface and focused onto the substrate for forming circuitry components. This approach appears to have merit where light intensity is used to form the desired pattern.

For many types of optical film, such as the film treated using the apparatus of U.S. Pat. No. 6,061,138, for example, the polarization state and direction of light, rather than light intensity, is used for conditioning alignment or other pattern formation in a photosensitive medium. Following the photolithography paradigm, masks have been employed in a number of devices used for exposure of optical film with polarized light, as is disclosed in U.S. Pat. No. 5,389,698 (Chigrinov et al.) It can be expected, however, that some of the same cost and deployment difficulties confronted when using masks in microlithography will also discourage the use of masks with optical film fabrication.

In an attempt to meet the need for an adaptive solution, U.S. Patent Application Publication No. 2002/0027624 A1 (Seiberle) discloses a transmissive optical component that acts as a mask, producing patterned, linearly polarized light. FIGS. 1A and 1B illustrate the basics of the process described for exposure of an optical film 40 comprising a photosensitive layer 20 and a substrate 10. A light source 1 emits a polarized light 91 having p-polarization. Transmissive mask 98, a transmissive LCD spatial light modulator, selectively modulates exposure beam 92 over each pixel area to provide either p-polarized light, as shown in FIG. 1A, or s-polarized light, as shown in FIG. 1B. As with the DMD solution for microlithography described above, the solution of U.S. Patent Application Publication No. 2002-0027624 A1 offers a mask solution that is dynamically changeable, eliminating the need to prepare and deploy separate masking components to support optical film fabrication.

When used for photo-alignment, photosensitive layer 20 is typically a thin photo-reactive alignment medium, typically linear photo-polymerization media (LPP), also known as photo-oriented polymer network (PPN). Photosensitive layer 20 is applied to substrate 10 and is then irradiated, typically using UV light, to provide a directional alignment bias.

There are a number of photo-alignment methods, based on different photoreaction processes. In general, a photo-alignment method may be one of three basic types:

(1) Isomerization, as disclosed in U.S. Pat. No. 4,974,941 (Gibbons et al.);
(2) Photo-dimerization, as disclosed in U.S. Pat. No. 5,602,661 (Schadt et al.); and
(3) Photo-dissociation, as taught in "Prospects of the photo-alignment technique for LCD fabrication" SID Digest 1997, pp. 311–314 (Iimura et al.).

Once photosensitive layer 20 is aligned, a liquid crystal polymer (LCP) layer is applied over the LPP layer that has been treated to provide a preferred alignment orientation. As is well known in the photoaligment art, LCP materials include cross-linkable liquid crystalline monomers, oligomers, or pre-polymers having cross-linkable groups. Depending on the intended application, the cross-linkable liquid crystal material may exhibit a nematic, smectic, or cholesteric phase.

Although transmissive LCD spatial light modulators have been used successfully in a number of projection display apparatus, these devices have inherent disadvantages for high-energy exposure environments. As is well-known in the optical arts, transmissive LCDs are fabricated onto a clear substrate, so that circuit traces and componentry reduce the active area of each LCD cell that modulates a pixel. As a result, the effective aperture size for each pixel is a fraction of the area available on the transmissive LCD. This is a significant constraint on the amount of light available for each pixel, whether considered in terms of brightness, irradiance, or exposure energy. As a result, higher energy light sources must be used, with low levels of efficiency. Due to device geometry, there are also limitations to the resolution levels that can be achieved. Thus, while the transmissive LCD of U.S. Patent Application Publication No. 2002/0027624 has some capability for adaptive pattern forming on optical film, there are inherent limitations with respect to allowable intensity and resolution. Imaging at other than 1:1 magnification presents further difficulties, due to interference effects and focus restrictions.

Reflective LCD spatial light modulators have been used to modulate the polarization of incident light in imaging apparatus for display and projection. In these devices, light directed to the reflective LCD via a polarization beamsplitter is modulated by selectively altering the polarization state of individual pixels of incident light. The reflected light is sent back in the same direction as the incident light, but is transmitted through the polarization beamsplitter along its way to a display surface. For example, LCD spatial light modulators have been developed and employed for digital projection systems for image display, such as is disclosed in U.S. Pat. No. 5,325,137 (Konno et al.) and in miniaturized image display apparatus suitable for mounting within a helmet or supported by eyeglasses, as is disclosed in U.S. Pat. No. 5,808,800 (Handschy et al.) Improvements in reflective LCD components have improved the resolution of these devices. Because each pixel cell in the LCD array is reflective, aperture sizes are maximized, providing significant improvements in brightness or irradiance when compared with transmissive LCDs. However, disclosed uses of reflective LCD components are in image-forming for print and projection apparatus.

Thus, it can be seen that, while there have been some solutions presented for fabricating a patterned optical film by exposure of photosensitive materials using masks, there is room for improvement, particularly with respect to light efficiency and resolution.

SUMMARY OF THE INVENTION

The object of the present invention is to provide an improved apparatus and method for forming a pattern in fabrication of optical film. With this object in mind, the present invention provides an apparatus for exposing a pattern onto a photosensitive medium, the apparatus comprising:

(a) a source of exposure radiation for providing an incident light beam to a polarization light modulator;

(b) a polarization light modulator comprising an array of pixels for modulating, at each pixel, the polarization state of the incident light beam;

(c) a reflective surface disposed to reflect, back through the photosensitive medium, a portion of the exposure beam transmitted through the photosensitive medium, in order to obtain a photoreactive response thereby; and wherein the source of exposure radiation and the reflective surface are on opposite sides of the photosensitive medium.

A feature of the present invention is the formation of a pattern onto a photosensitive medium by modulating the polarization of a beam of light that is directed toward the photosensitive layer.

It is an advantage of the present invention that, because it uses an LCD spatial light modulator as a "mask," it allows a pattern to be changed quickly, even during exposure operation.

It is a further advantage of the present invention that it employs reflective means for supplementing the radiant energy available from modulated light.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figure 1A:
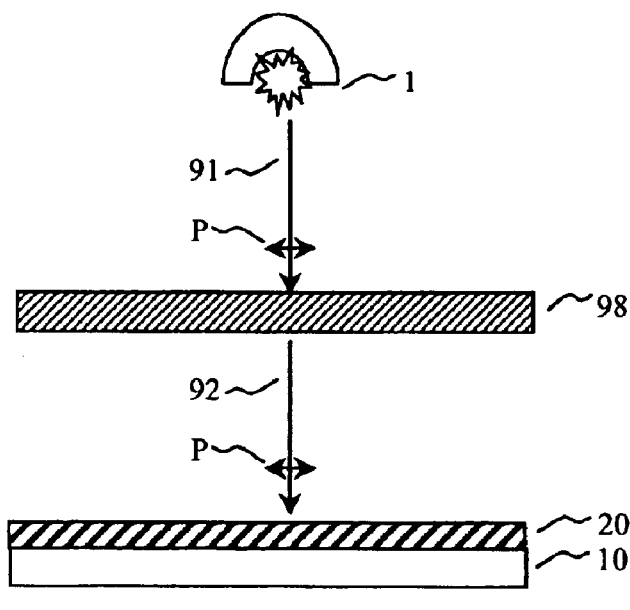
FIGS. 1A and 1B show schematics of a prior art exposure apparatus for exposing a pattern onto optical film using a transmissive LCD for modulating polarization state.
Figure 1B:
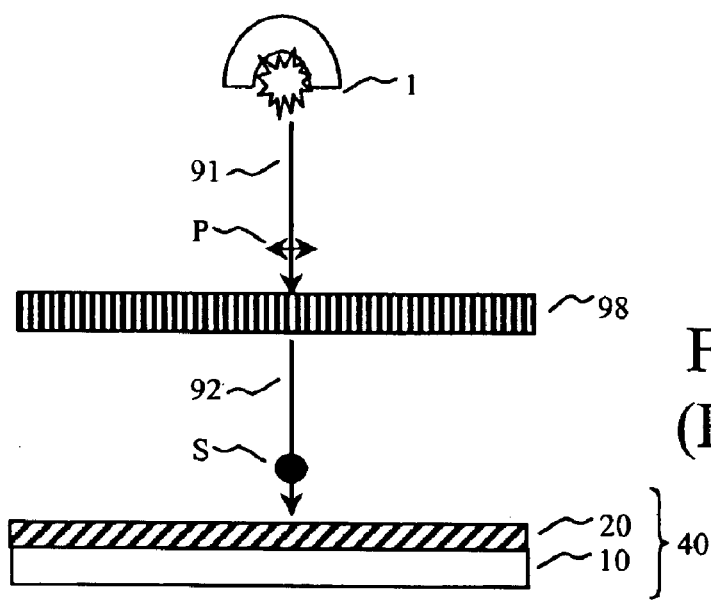

The present description is directed in particular to elements forming part of, or cooperating more directly with, apparatus in accordance with the invention. It is to be understood that elements not specifically shown or described may take various forms well known to those skilled in the art.

For the purposes of this application, the terms "photosensitive" and "photoreactive" are considered to be equivalent. In a preferred embodiment, the system and method of the present invention are directed to exposure of photoreactive materials in optical films used for alignment of LCP layers, however, the system and methods disclosed herein can be more broadly applied to fabrication of optical films overall, wherever a layer of photosensitive material is exposed or irradiated to take advantage of a photoreaction as part of optical film manufacture.

With respect to optical films, a substrate layer must have sufficient mechanical strength to serve as a support for additional layers. In roll-to-roll web fabrication, a substrate must have sufficient strength to allow it to be wound or unwound from a roll, for example. Typical substrate materials for optical film include triacetate cellulose (TAC), polyester, polycarbonate, or other transparent polymers, with thickness typically in the 25 to 500 micrometer range. By comparison, an orientation layer or anisotropic layer comprising photoreactive material is typically less than about five micrometers thick and often less than two micrometers thick; such layers cannot be used or considered as a substrate. For the preferred embodiment, optical film is fabricated along a web in a roll-to-roll manufacturing process. However, the apparatus and methods of the present invention could be generally applied to applications using glass or other rigid material as a substrate.

In the apparatus and method of the present invention, exposure irradiation is used to condition photoreactive media for fabrication of an optical film. The term "condition," as used here, must be properly understood. In the preferred embodiment, exposure energy conditions the optical film by causing an alignment photoreaction. Typical alignment photoreactions include isomerization, photo-dimerization, and photo-dissociation, as described in the background section above. However, the method of the present invention can be used with other types of conditioning, including curing for example.

As is well known in the art, optical materials may have up to three different principal indices of refraction and can be classified as either isotropic or anisotropic based on the relationship of these indices. When all three of its principal indices are equal, a material is considered to be isotropic. When anisotropic, a material can be either uniaxial, or biaxial. When two principal indices are equal, a material is considered to be uniaxial. An uniaxial material is uniquely characterized as having an ordinary index, referred as $n_o$, an extraordinary index $n_e$, and two angles describing the orientation of its optical axis, the axis of $n_e$. When $n_e$ is greater than $n_o$, an uniaxial material is positively birefringent. When $n_e$ is smaller than $n_o$, an uniaxial material is negatively birefringent. Controlling birefringent behavior is particularly useful in the fabrication and application of optical films. When all three refractive indices differ, a material is considered to be biaxial, uniquely specified by its principal indices $nx_O$, $ny_O$, $nz_O$, and three orientational angles.

Figure 2A:
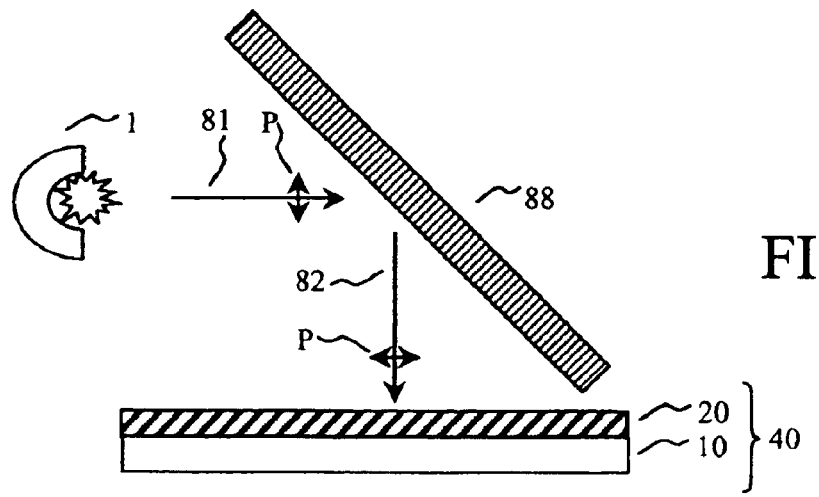
FIGS. 2A and 2B show schematics of an apparatus of the present invention for exposing a pattern onto optical film using a reflective LCD for modulating polarization state.
Figure 2B:
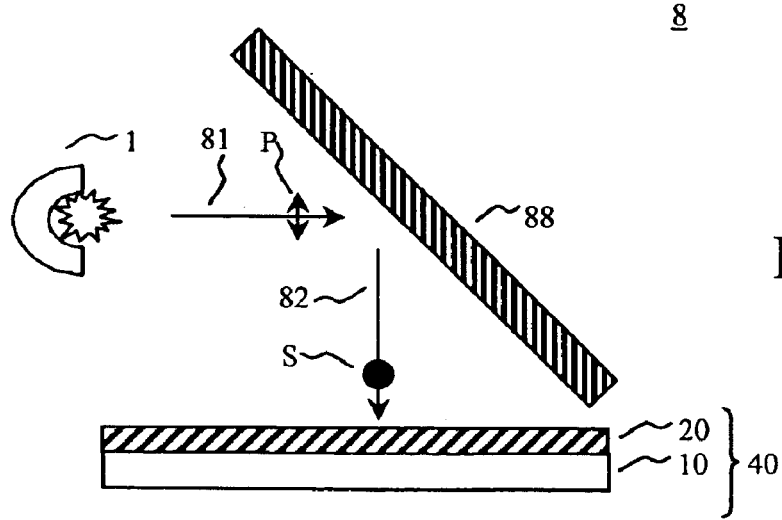

FIGS. 2A and 2B show an exposure apparatus 8 for fabrication of optical film 40 having a pattern formed by exposure to polarized light. A reflective polarization modulation device 88 modulates the polarization state of an incident light beam 81 from light source 1. A modulated exposure beam 82 is directed to photosensitive layer 20 which is coupled to a substrate 10.

Reflective polarization modulation device 88 is a reflective LCD spatial light modulator in one embodiment. The reflective LCD provides an array of pixels, each of which can be individually addressed and modulated. FIG. 2A shows the behavior of reflective polarization modulation device 88 for an unmodulated pixel, where the polarization state of the pixel in modulated exposure beam 82 is the same p-polarization state as the state of incident light beam 81. FIG. 2B shows the modulation of a pixel to an s-polarization state. The arrangement of modulated and unmodulated pixels on reflective polarization modulation device 88 determines the pattern imposed on photosensitive layer 20 by modulated exposure beam 82.

It must be observed that the diagonal positioning of FIGS. 2A and 2B is only one of the numerous possible angular arrangements for reflective polarization modulation device 88 relative to light source 1 and the surface of optical film 40. With the arrangement of FIGS. 2A and 2B, exposure beam 82 is incident at a normal to optical film 40. For some types of photosensitive layer 20, including many types of alignment media, oblique incidence is desirable. Thus, the relative angle of reflective polarization modulation device 88 can be utilized to provide exposure beam 82 incidence at a suitable angle for the type of optical film 40 being fabricated. It must also be noted that incident light beam 81 and exposure beam 82 may be collimated for some applications; specific types of photosensitive material may exhibit improved response to collimated light.

It should be understood that exposure apparatus 8 can be used with a number of different types of photosensitive layer 20, depending on the function of optical film 40. Photosensitive layer 20 may be sensitive to exposure irradiation from UV light, from visible light, or even from infrared light. During exposure, optical film 40 could be stationary, provided as individual sheets, for example. Alternately, optical film 40 could be provided on a web, such as in a roll-to-roll manufacturing operation. Optical film 40 could have any number of layers, in addition to at least one photosensitive layer 20. Clearly, best results and maximum efficiency are obtained when exposure apparatus 8 is suitably matched to the sensitivity characteristics of photosensitive layer 20 in optical film 40. Exposure apparatus 8 could have applications beyond that of film fabrication; substrate 10 could be glass or other hard material upon which photosensitive layer 20 is treated.

The pattern imposed on optical film 40 could be a static pattern, such as for an alignment film. However, exposure apparatus 8 is capable of applying other types of pattern. For example, identity or security images or some other type of patterning can be applied within the scope of the present invention.

Light source 1 provides polarized light and may include an optional filter for providing light having a specific range or ranges of wavelengths.

Figure 3A:
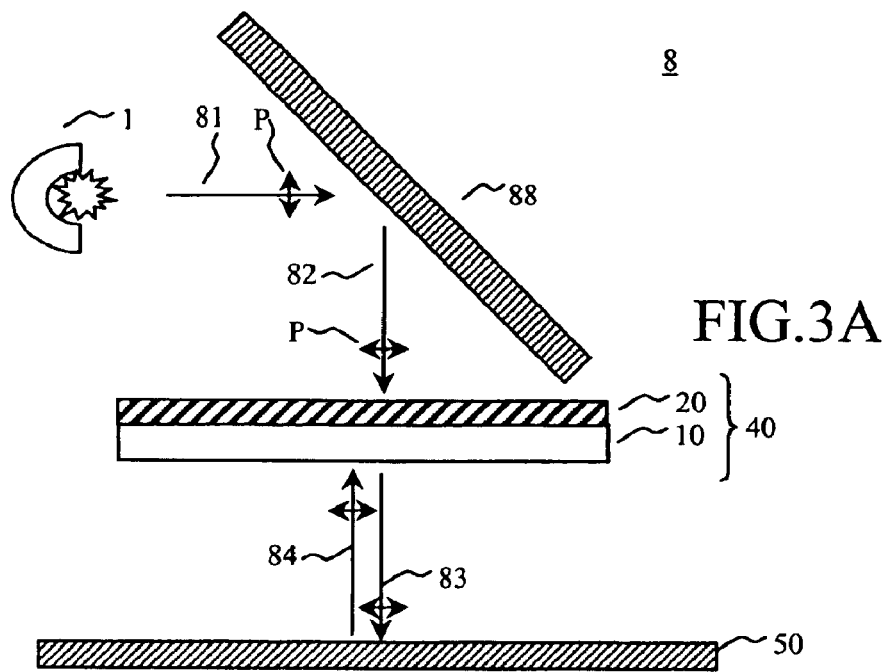
FIGS. 3A and 3B show schematics of an optional embodiment of the present invention using a reflective surface to re-use exposure energy that had been transmitted through the optical film when using a reflective spatial light modulator.
Figure 3B:
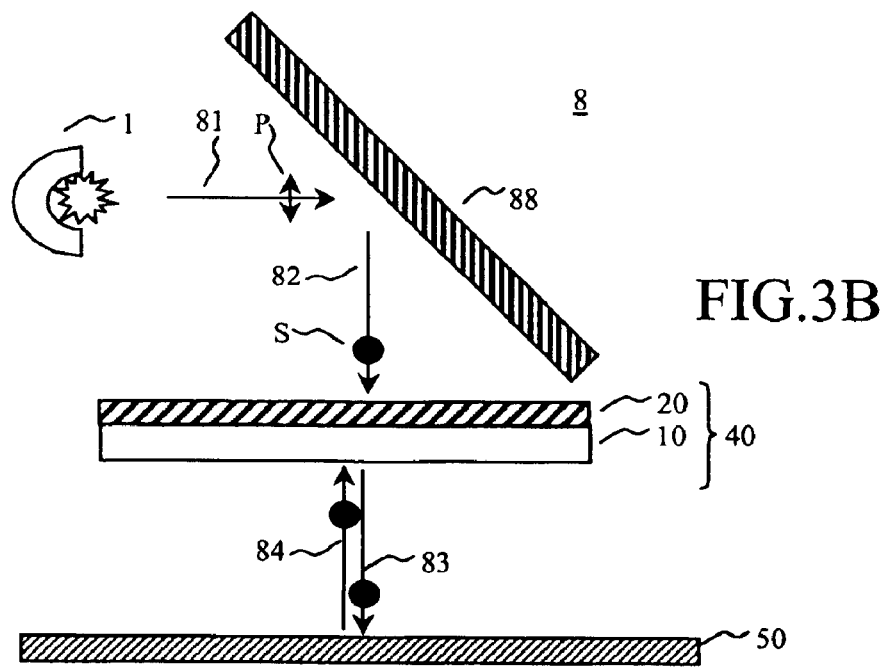

Referring to FIGS. 3A and 3B, an embodiment of the present invention is shown in which exposure apparatus 8 includes a reflective surface 50 for re-using a portion of the exposure energy, as disclosed commonly-assigned copending U.S. patent application Ser. No. 10/242,564. Reflective surface 50 is located opposite reflective polarization modulator 88 with respect to optical film 40. Reflective surface 50 reflects a portion of a residual beam 83 back as a reflected beam 84 toward optical film 40. As is represented in FIGS. 3A and 3B, reflected beam 84 preserves the polarization state of residual beam 83, independent of the pixel state at reflective polarization modulator 88. By re-using exposure energy that would otherwise be wasted, the arrangement of FIGS. 3A and 3B can help to increase the overall efficiency of exposure apparatus 8. The re-used reflected beam 84 could be used to complement the pattern-forming function of reflective polarization modulator 88 by adding to the photoreactive response achieved by exposure beam 82. Alternately, reflected beam 84 could have an opposing effect, mediating the photoreactive response achieved by exposure beam 82. Reflected beam 84 could further serve some alternate purpose, such as providing energy for curing, for example. As is noted in commonly-assigned copending U.S. patent application Ser. No. 10/242,564, reflective surface 50 may be a mirror or a retroreflective surface, and may be oriented parallel to the surface of optical film 40 or at some oblique angle relative to that surface. To aid in fabrication of optical film 40, reflective surface 50 may be coupled to optical film 40, such as using static attraction or an adhesive for example.

Figure 4A:
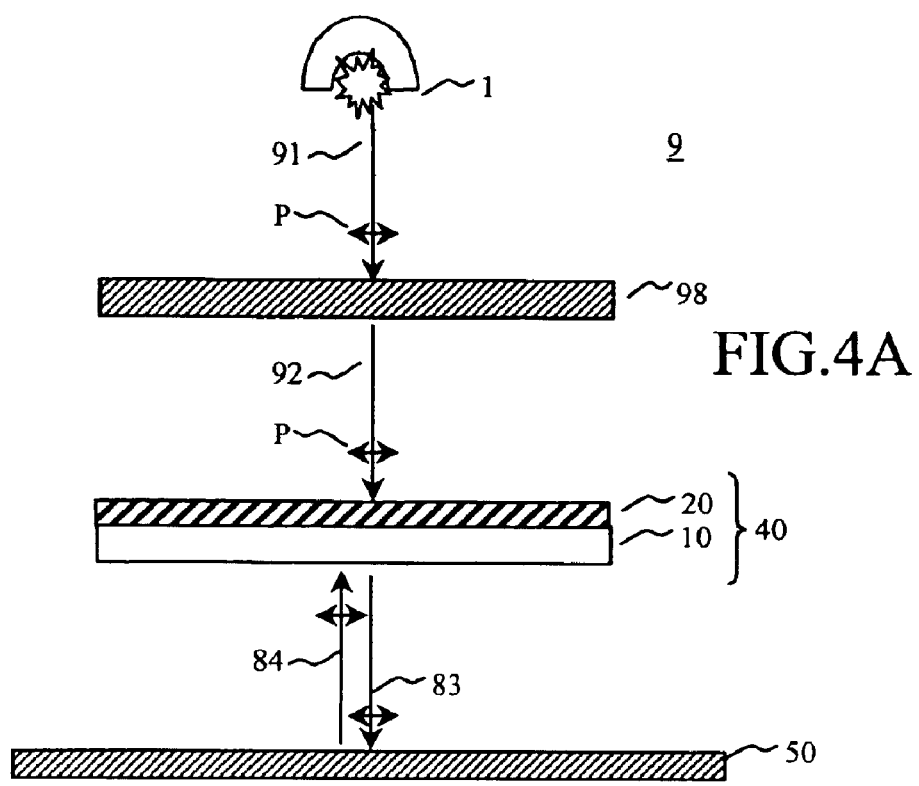
FIGS. 4A and 4B show schematics of an optional embodiment of the present invention using a reflective surface to re-use exposure energy that had been transmitted through the optical film when using a transmissive spatial light modulator.
Figure 4B:
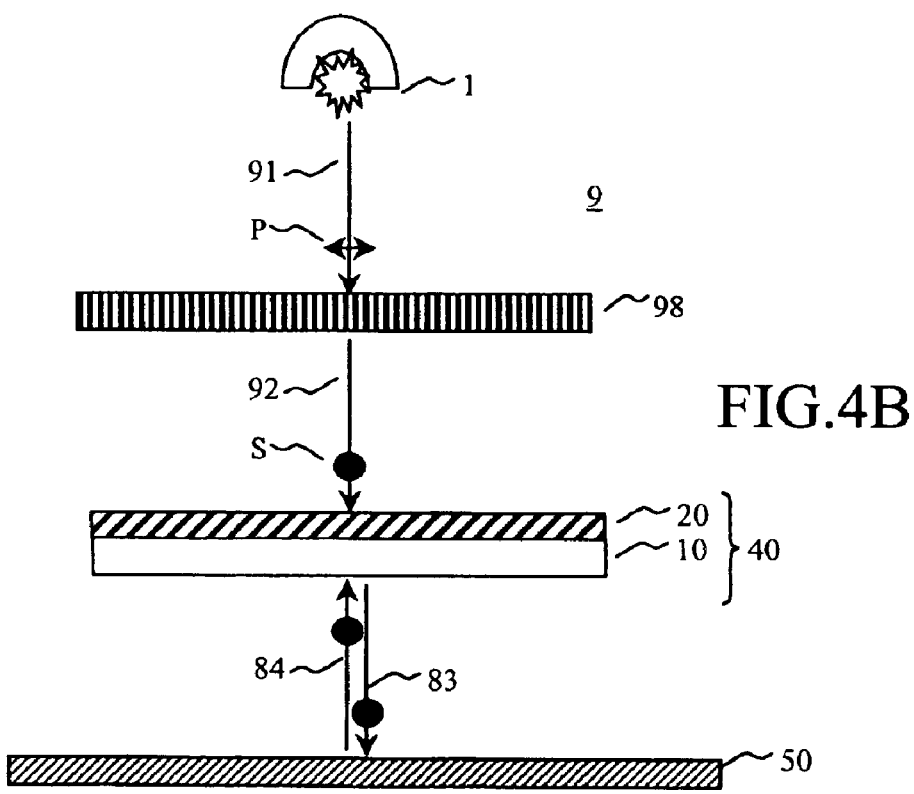

Referring to FIGS. 4A and 4B, another embodiment of the present invention is shown in which an exposure apparatus 9 employs reflective surface 50 in cooperation with a transmissive spatial light modulator as transmissive mask 98. This embodiment also allows re-use of a portion of the exposure energy, as described above for the reflective embodiment of FIGS. 3A and 3B. The embodiment of FIGS. 4A and 4B helps to increase the exposure energy available when using a transmissive spatial light modulator, to help compensate for shortcomings of the transmissive mask method, as noted in the background material above.

The invention has been described in detail with particular reference to certain preferred embodiments thereof, but it will be understood that variations and modifications can be effected within the scope of the invention. Therefore, what is provided is an improved apparatus and method for forming a pattern in fabrication of optical film using a spatial light modulator.

What is claimed is:

1. An apparatus for exposing a pattern onto a photosensitive medium, the apparatus comprising:
    (a) a source of exposure radiation for providing an incident light beam to a polarization light modulator; and
    (b) said polarization light modulator comprising an array of pixels for modulating, at each pixel said incident light beam in order to transmit an exposure beam to the photosensitive medium; and,
    (c) a reflective surface disposed to reflect, back through the photosensitive medium, a portion of said exposure beam transmitted through the photosensitive medium, in order to obtain a photoreactive response thereby; and wherein said source of exposure radiation and said reflective surface are on opposite sides of the photosensitive medium, and wherein said polarization light modulator is a transmissive LCD spatial light modulator.

2. An apparatus according to claim 1 wherein said photosensitive medium is a linear photo-polymerization medium.

3. An apparatus according to claim 1 wherein said exposure beam causes isomerization in the photosensitive medium.

4. An apparatus according to claim 1 wherein said exposure beam causes photo-dimerization in the photosensitive medium.

5. An apparatus according to claim 1 wherein said exposure beam causes photo-dissociation in the photosensitive medium.

6. An apparatus for fabricating optical films as in claim 1 wherein said source of exposure radiation provides UV light.

7. An apparatus according to claim 1 wherein said exposure beam is directed at an oblique angle with respect to the surface of the photosensitive medium.

8. An apparatus according to claim 1 wherein said exposure beam is directed at a normal with respect to the surface of the photosensitive medium.

9. An apparatus according to claim 1 further comprising transport means for moving said photosensitive medium through an exposure zone.

10. An apparatus according to claim 1 wherein said photosensitive medium is coupled to a substrate.

11. An apparatus according to claim 1 wherein said photosensitive medium is LCP.

12. An apparatus according to claim 1 wherein said reflective surface is retroreflective.

13. An apparatus according to claim 1 wherein said reflective surface is coupled to the photosensitive medium.

14. An apparatus according to claim 1 wherein said reflective surface is at an oblique angle relative to the surface of the photosensitive medium.

15. A method for exposing a pattern onto a photosensitive medium, comprising:
    (a) directing a polarized beam toward a polarization light modulator as an incident light beam;
    (b) modulating said incident light beam by modulating the polarization state of pixels within said polarization light modulator to transmit a modulated exposure beam onto the photosensitive medium; and
    (c) reflecting, back toward the photosensitive medium, a portion of said modulated exposure beam that has been transmitted through the photosensitive medium, and wherein the step of modulating said incident light beam comprises the step of modulating the polarization state of pixels within a transmissive spatial light modulator.

16. The method for exposing a pattern onto a photosensitive medium of claim 15 further comprising transporting the photosensitive medium through said modulated exposure beam.

17. The method for exposing a pattern onto a photosensitive medium of claim 15 wherein the step of directing a polarized beam comprises the step of generating UV light.

18. The method for exposing a pattern onto a photosensitive medium of claim 15 wherein said modulated exposure beam is directed onto the photosensitive medium at an oblique angle.

19. The method for exposing a pattern onto a photosensitive medium of claim 15 wherein said photosensitive medium comprises a linear photo-polymerization medium.

* * * * *